(12) United States Patent       (10) Patent No.:     US 7,528,728 B2
Oliver et al.                   (45) Date of Patent:    May 5, 2009

(54) CIRCUITS FOR RFID TAGS WITH MULTIPLE NON-INDEPENDENTLY DRIVEN RF PORTS

(75) Inventors: Ronald A. Oliver, Seattle, WA (US); Christopher J. Diorio, Shoreline, WA (US); Todd E. Humes, Shoreline, WA (US)

(73) Assignee: IMPINJ Inc., Seattle, WA (US)

( * ) Notice: Subject to any disclaimer, the term of this patent is extended or adjusted under 35 U.S.C. 154(b) by 88 days.

(21) Appl. No.: 11/213,631

(22) Filed: Aug. 26, 2005

(65) Prior Publication Data

US 2006/0055620 A1   Mar. 16, 2006

Related U.S. Application Data

(63) Continuation of application No. 10/812,493, filed on Mar. 29, 2004, now abandoned.

(51) Int. Cl.
    G08B 21/00   (2006.01)
    G08B 9/00    (2006.01)
(52) U.S. Cl. ............. 340/572.8; 340/572.1; 340/572.4; 340/653; 340/660; 340/661
(58) Field of Classification Search ........................ None
    See application file for complete search history.

(56) References Cited

U.S. PATENT DOCUMENTS

| 4,315,272 A | 2/1982 | Vorhaus |
| 4,479,260 A | 10/1984 | Harrop |
| 4,584,709 A | 4/1986 | Kneisel et al. |
| 4,611,184 A | 9/1986 | Kumar |
| 4,730,188 A | 3/1988 | Milheiser |
| 4,742,567 A | 5/1988 | Ohe et al. |
| 4,783,783 A | 11/1988 | Nagai et al. |
| 4,809,009 A | 2/1989 | Grimes et al. |
| 4,857,893 A | 8/1989 | Carroll |
| 4,864,314 A | 9/1989 | Bond |
| 4,935,702 A | 6/1990 | Mead et al. |
| 4,953,157 A | 8/1990 | Franklin et al. |
| 4,977,616 A | 12/1990 | Linder et al. |

(Continued)

FOREIGN PATENT DOCUMENTS

EP           0 298 618         1/1989

(Continued)

OTHER PUBLICATIONS

Carley, L. Richard, "Trimming Analog Circuits Using Floating-Gate Analog MOS Memory", IEEE Journal of Solid-State Circuits, vol. 24, No. 6, Dec. 1989, pp. 1569-1575.

(Continued)

Primary Examiner—Julie Bichngoc Lieu
(74) Attorney, Agent, or Firm—Thelen LLP; David B. Ritchie

(57) ABSTRACT

A circuit for an RFID tag has at least two RF ports for driving points of the antenna that may correspond to different RF polarizations. The RF ports may be driven by a common modulating signal, or by separate modulating signals. Further, the ports may be coupled and uncoupled together, responsive to a control signal. The control signal may be the same as one or both of the modulating signals.

43 Claims, 10 Drawing Sheets

U.S. PATENT DOCUMENTS

| | | | |
|---|---|---|---|
| 5,068,668 A | 11/1991 | Tsuda et al. | |
| 5,075,691 A | 12/1991 | Garay et al. | |
| 5,142,292 A | 8/1992 | Chang | |
| 5,175,418 A | 12/1992 | Tanaka | |
| 5,280,286 A | 1/1994 | Williamson | |
| 5,430,441 A | 7/1995 | Bickley et al. | |
| 5,448,110 A | 9/1995 | Tuttle et al. | |
| 5,499,397 A | 3/1996 | Wadin et al. | |
| 5,507,035 A | 4/1996 | Bantz et al. | |
| 5,528,222 A | 6/1996 | Moskowitz et al. | |
| 5,572,226 A | 11/1996 | Tuttle | |
| 5,719,586 A | 2/1998 | Tuttle | |
| 5,771,021 A | 6/1998 | Veghte et al. | |
| 5,805,632 A | 9/1998 | Leger | |
| 5,825,329 A | 10/1998 | Veghte et al. | |
| 5,842,118 A | 11/1998 | Wood, Jr. | |
| 5,923,300 A | 7/1999 | Mejia | |
| 5,929,760 A | 7/1999 | Monahan | |
| 5,933,039 A | 8/1999 | Hui et al. | |
| 5,939,945 A | 8/1999 | Thewes et al. | |
| 5,952,922 A | 9/1999 | Shober | |
| 5,995,048 A | 11/1999 | Smithgall et al. | |
| 6,005,529 A | 12/1999 | Hutchinson | |
| 6,025,784 A | 2/2000 | Mish | |
| 6,043,746 A | 3/2000 | Sorrels | |
| 6,045,652 A | 4/2000 | Tuttle et al. | |
| 6,057,803 A | 5/2000 | Kane et al. | |
| 6,060,815 A | 5/2000 | Nysen | |
| 6,069,564 A | 5/2000 | Hatano et al. | |
| 6,078,259 A | 6/2000 | Brady et al. | |
| 6,078,791 A | 6/2000 | Tuttle et al. | |
| 6,097,345 A | 8/2000 | Walton | |
| 6,118,379 A | 9/2000 | Kodukula et al. | |
| 6,130,570 A * | 10/2000 | Pan et al. | 327/431 |
| 6,130,612 A | 10/2000 | Castellano et al. | |
| 6,130,632 A | 10/2000 | Opris | |
| 6,134,182 A | 10/2000 | Pilo | |
| 6,147,605 A | 11/2000 | Vega et al. | |
| 6,147,655 A | 11/2000 | Roesner | |
| 6,166,706 A | 12/2000 | Gallagher et al. | |
| 6,184,841 B1 | 2/2001 | Shober et al. | |
| 6,215,402 B1 | 4/2001 | Rao Kodukula et al. | |
| 6,249,260 B1 | 6/2001 | Holloway | |
| 6,266,362 B1 | 7/2001 | Tuttle et al. | |
| 6,268,796 B1 | 7/2001 | Gnadinger et al. | |
| 6,271,793 B1 | 8/2001 | Brady et al. | |
| 6,281,794 B1 | 8/2001 | Duan et al. | |
| 6,320,788 B1 | 11/2001 | Sansbury et al. | |
| 6,340,932 B1 | 1/2002 | Rodgers et al. | |
| 6,346,922 B1 | 2/2002 | Proctor et al. | |
| 6,357,025 B1 | 3/2002 | Tuttle | |
| 6,366,260 B1 | 4/2002 | Carrender | |
| 6,366,629 B1 | 4/2002 | Chen et al. | |
| 6,396,438 B1 | 5/2002 | Seal | |
| 6,445,297 B1 | 9/2002 | Nicholson | |
| 6,501,807 B1 | 12/2002 | Chieu et al. | |
| 6,517,000 B1 | 2/2003 | McAllister et al. | |
| 6,571,617 B2 | 6/2003 | Van Niekerk et al. | |
| 6,603,801 B1 | 8/2003 | Andren et al. | |
| 6,677,917 B2 | 1/2004 | Van Heerden et al. | |
| 6,700,491 B2 | 3/2004 | Shafer | |
| 6,701,605 B2 | 3/2004 | Huffer et al. | |
| 6,717,923 B1 | 4/2004 | Smith | |
| 6,720,930 B2 | 4/2004 | Johnson et al. | |
| D492,670 S | 7/2004 | Hung et al. | |
| D493,446 S | 7/2004 | Hung et al. | |
| 6,830,193 B2 | 12/2004 | Tanaka | |
| 6,885,344 B2 | 4/2005 | Mohamadi | |
| 7,005,968 B1 | 2/2006 | Bridgelall | |
| 7,030,786 B2 | 4/2006 | Kaplan et al. | |
| 7,123,171 B2 | 10/2006 | Kaplan et al. | |
| 7,214,569 B2 | 5/2007 | Swindlehurst et al. | |
| 2001/0043162 A1 | 11/2001 | Babb | |
| 2002/0067315 A1 | 6/2002 | Kunysz | |
| 2002/0075184 A1 | 6/2002 | Tuttle | |
| 2002/0109636 A1 | 8/2002 | Johnson et al. | |
| 2002/0126057 A1 | 9/2002 | King et al. | |
| 2002/0167405 A1 | 11/2002 | Shanks et al. | |
| 2003/0090313 A1 * | 5/2003 | Burgener et al. | 327/408 |
| 2003/0184495 A1 | 10/2003 | Tomon | |
| 2004/0001024 A1 | 1/2004 | Killen et al. | |
| 2004/0075616 A1 | 4/2004 | Endo et al. | |
| 2004/0113746 A1 * | 6/2004 | Brindle | 337/167 |
| 2004/0125023 A1 | 7/2004 | Fujii et al. | |
| 2004/0178265 A1 | 9/2004 | Bui et al. | |
| 2004/0183743 A1 | 9/2004 | Reasoner et al. | |
| 2005/0028032 A1 * | 2/2005 | Klein | 714/13 |
| 2005/0104789 A1 | 5/2005 | Hashidate et al. | |
| 2005/0104793 A1 | 5/2005 | Yuanzhu | |
| 2005/0104797 A1 | 5/2005 | McCollum | |
| 2005/0134460 A1 | 6/2005 | Usami | |
| 2005/0190111 A1 | 9/2005 | King et al. | |
| 2005/0212674 A1 | 9/2005 | Desmons et al. | |
| 2005/0225435 A1 | 10/2005 | Diorio et al. | |
| 2005/0227631 A1 * | 10/2005 | Robinett | 455/83 |
| 2005/0253688 A1 | 11/2005 | Fukuda | |
| 2005/0259030 A1 | 11/2005 | Mizuno et al. | |
| 2005/0270185 A1 | 12/2005 | Esterberg | |
| 2005/0270189 A1 | 12/2005 | Kaplan et al. | |
| 2006/0001579 A1 | 1/2006 | Noro et al. | |
| 2006/0028379 A1 | 2/2006 | Oberle | |
| 2006/0038724 A1 | 2/2006 | Tikhov et al. | |
| 2006/0038725 A1 | 2/2006 | Tikhov et al. | |
| 2006/0038730 A1 | 2/2006 | Parsche | |
| 2006/0044192 A1 | 3/2006 | Egbert | |
| 2006/0055620 A1 | 3/2006 | Oliver et al. | |
| 2006/0109128 A1 | 5/2006 | Barink et al. | |
| 2006/0139223 A1 | 6/2006 | Li et al. | |
| 2006/0145926 A1 | 7/2006 | Choi et al. | |
| 2006/0186995 A1 | 8/2006 | Wu et al. | |
| 2006/0208897 A1 | 9/2006 | Chiu et al. | |
| 2006/0208900 A1 | 9/2006 | Tavassoli Hozouri | |
| 2006/0238301 A1 | 10/2006 | Wu et al. | |
| 2006/0244676 A1 | 11/2006 | Uesaka | |
| 2006/0262023 A1 | 11/2006 | Engargiola et al. | |
| 2007/0024446 A1 | 2/2007 | Hyde et al. | |
| 2007/0096993 A1 | 5/2007 | Tikhov et al. | |
| 2007/0103379 A1 | 5/2007 | Garby et al. | |
| 2007/0152901 A1 | 7/2007 | Hockey et al. | |
| 2007/0205953 A1 | 9/2007 | Bombay et al. | |

FOREIGN PATENT DOCUMENTS

| | | |
|---|---|---|
| EP | 0416264 A2 | 3/1991 |
| EP | 0435137 A2 | 7/1991 |
| WO | 01 73854 | 10/2001 |
| WO | WO 2004/063982 A1 | 7/2004 |

OTHER PUBLICATIONS

Raszka et al., "Embedded Flash Memory for Security Applications in a 0.13 μm CMOS Logic Process", Digest of Technical Papers, IEEE International Solid-State Circuits Conference 2004, p. 46.

Weis, Stephen A., et al., Security and Privacy Aspects of Low-Cost Radio Frequency Identification Systems, Laboratory for Computer Science, Auto-ID Center, Massachusetts Institute of Technology, pp. 1-12.

Yoshida, Junko, EE Times, "RFID "kill" Feature Aims to Soothe Privacy Fears", Apr. 28, 2003.

Jonietz, Erika, Technology Review, "Tracking Privacy", Jul./Aug. 2004, pp. 74-75.

Partial International Search for International Application No. PCT/US03/31792, date mailed Apr. 2, 2004.

"An Overview of the Serial Digital Interface," 1994, pp. 1-28, SGS-Thomson Microelectronics.

International Search Report and Written Opinion, Application No. PCT/US2005/009949, dated Jul. 6, 2005.

International Search Report, Application No. PCT/US2005/009955, date mailed Jul. 12, 2005.

* cited by examiner

CIRCUITS FOR RFID TAGS WITH MULTIPLE NON-INDEPENDENTLY DRIVEN RF PORTS

CROSS-REFERENCE TO RELATED APPLICATION

This application is a continuation of parent application Ser. No. 10/812,493, entitled "Circuits for RFID Tags with Multiple Non-Independently Driven RF Ports" by Ronald A. Oliver, Christpher J. Diorio and Todd E. Humes, filed on Mar. 29, 2004 now abandoned.

FIELD OF THE INVENTION

The present invention is related to the field of Radio Frequency IDentification (RFID), and more specifically to devices, circuits, and methods for using multiple RF ports in RFID tag-to-reader communications.

BACKGROUND

Radio Frequency IDentification (RFID) tags can be used in many ways for locating and identifying objects that they are attached to. RFID tags are particularly useful in product-related and service-related industries for tracking large numbers of objects are being processed, inventoried, or handled. In such cases, an RFID tag is usually attached to individual items, or to their packages.

In principle, RFID techniques entail using a device called an RFID reader to interrogate one or more RFID tags. Interrogation is performed by the reader transmitting a Radio Frequency (RF) wave. A tag that senses the interrogating RF wave responds by transmitting back another RF wave, a process known as backscatter. The response may further encode a number stored internally in the tag. The response, and the number if available, is decoded by the reader, which thereby identifies, counts, or otherwise interacts with the associated item. The number can denote a serial number, a price, a date, a destination, other attribute(s), any combination of attributes, and so on.

An RFID tag includes an antenna system, a radio section, a logical section, and a memory. Advances in semiconductor technology have miniaturized the electronics so much that an RFID tag can generate the backscatter while powered by only the RF signal it receives, enabling some RFID tags to operate without a battery.

It is desirable that the antenna system have components such that it is able to sense many possible types of interrogating RF waves, and from many possible directions, regardless of the orientation of the tag. For example, some RFID tags are provided with antennas that are suitable for sensing RF waves of different polarization. It has been known to have a system of two antennas, driving them independently of each other to generate two backscatter signals. Such is taught, for example in Patent Application US 2002/0167405A1, published on 2002Nov. 14 to Shanks et al. Independent driving, however, requires more circuitry and more power than single antenna systems.

BRIEF SUMMARY

The invention improves over the prior art. Briefly, the invention drives different points of an antenna system of an RFID tag non-independently. The invention provides devices and circuits that may be used for RFID tags, and which have multiple non-independent RF ports. The invention also provides methods for driving such RF ports non-independently from each other. These in turn may drive corresponding points of the antenna system of the RFID tag. The invention is particularly advantageous where different antenna points correspond to different polarizations.

In one embodiment, two RF ports are driven by a common modulating signal, for example to enable a single modulator to be used for generating backscatter in two polarizations.

In another embodiment, two RF ports are driven by either separate modulating signals, or by the common modulating signal as above. Further, the ports may be coupled and uncoupled together, responsive to a control signal. As yet another option, the control signal may be the same as one or both of these modulating signals.

The invention further provides for an RFID antenna driver implemented in a semiconductor device with non-independent RF ports. These and other features and advantages of the invention will be better understood from the specification of the invention, which includes the following Detailed Description and accompanying Drawings.

BRIEF DESCRIPTION OF THE DRAWINGS

The following Detailed Description proceeds with reference to the accompanying Drawings, in which.

DETAILED DESCRIPTION

Figure 1:
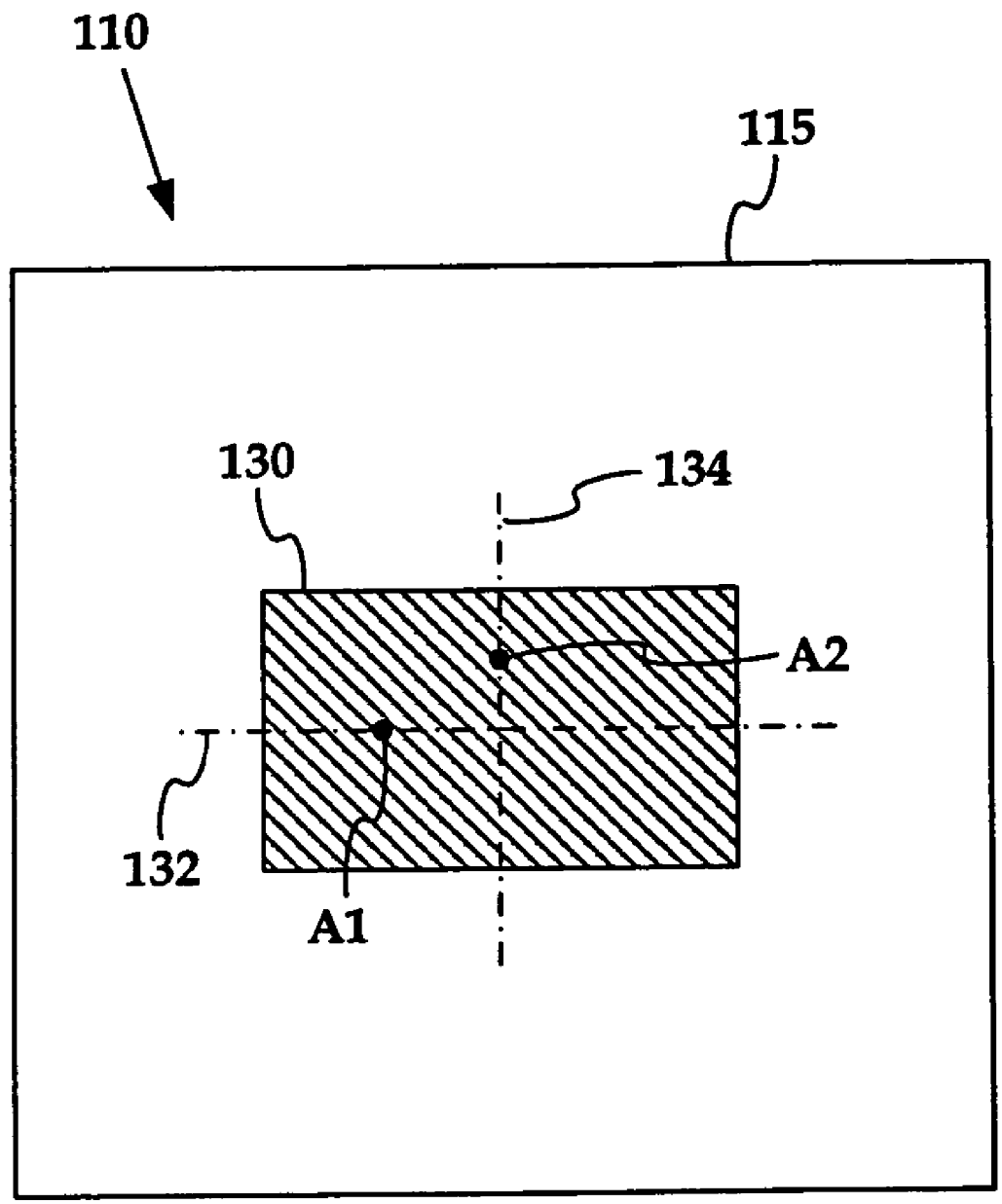
FIG. 1 is a view of an RFID tag with a first sample type of antenna system.

The present invention is now described. While it is disclosed in its preferred form, the specific embodiments of the invention as disclosed herein and illustrated in the drawings are not to be considered in a limiting sense. Rather, these embodiments are provided so that this disclosure will be thorough and complete, and will fully convey the scope of the invention to those skilled in the art. Indeed, it should be readily apparent in view of the present description that the invention may be modified in numerous ways. Among other things, the present invention may be embodied as devices, circuits, methods, and so on. The following detailed description is, therefore, not to be taken in a limiting sense.

As used herein, the symbol n+ indicates an n-doped semiconductor material typically having a doping level of n-type dopants on the order of $10^{21}$ atoms per cubic centimeter. The symbol n− indicates an n-doped semiconductor material typically having a doping level on the order of $10^{17}$ atoms per cubic centimeter. The symbol p+ indicates a p-doped semiconductor material typically having a doping level of p-type dopants on the order of $10^{21}$ atoms per cubic centimeter. The symbol p− indicates a p-doped semiconductor material typically having a doping level on the order of $10^{17}$ atoms per cubic centimeter. Those of ordinary skill in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skill in the art. Such persons of ordinary skill in the art will now also realize that a range of doping concentrations around those described above will also work. Essentially, any process capable of forming pFETs and nFETs will work. Doped regions may be diffusions or they may be implanted.

As has been mentioned, the invention drives different points of an antenna system of an RFID tag non-independently. The invention is now described in more detail.

The invention may be used with RFID tags having many types of antenna systems. Two such systems are described below as a way of example, but not of limitation.

FIGURE is a view of a sample RFID tag 110 that may be used with the invention. Tag 110 is formed on a substrate 115, which does not conduct. Tag 110 has an antenna system that includes a rectangular conductive plate 130. Preferably it also includes a complementary matching plate (not shown) on the opposite of substrate 115.

Conductive plate 130 has two main directions, one along horizontal axis 132 and one along vertical axis 134. The two directions result in two resonant modes for plate 130. The geometry of plate 130 is especially useful if the interrogating RF wave is circularly polarized.

Backscatter signals may be generated by a circuit that resides on a chip (not shown in FIG. 1), and connected to the antenna system. The circuit receives an interrogating RF signal through the antenna during a receive phase, and drives the antenna system accordingly, during a transmit phase. Driving may be performed at points on antenna plate 130 that are optimal for the prevailing resonant modes. Such points may, for example, be at antenna point A1 on axis 132 for a first polarization, and at antenna point A2 on axis 134 for a second polarization. Of course, driving may be with respect to a reference, which in turn may be applied to a complementary point of the complementary matching plate. For driving the antenna, wires (not shown) couple the circuit with antenna points A1, A2, and also with their complementary points on the complementary matching plate.

Figure 2:
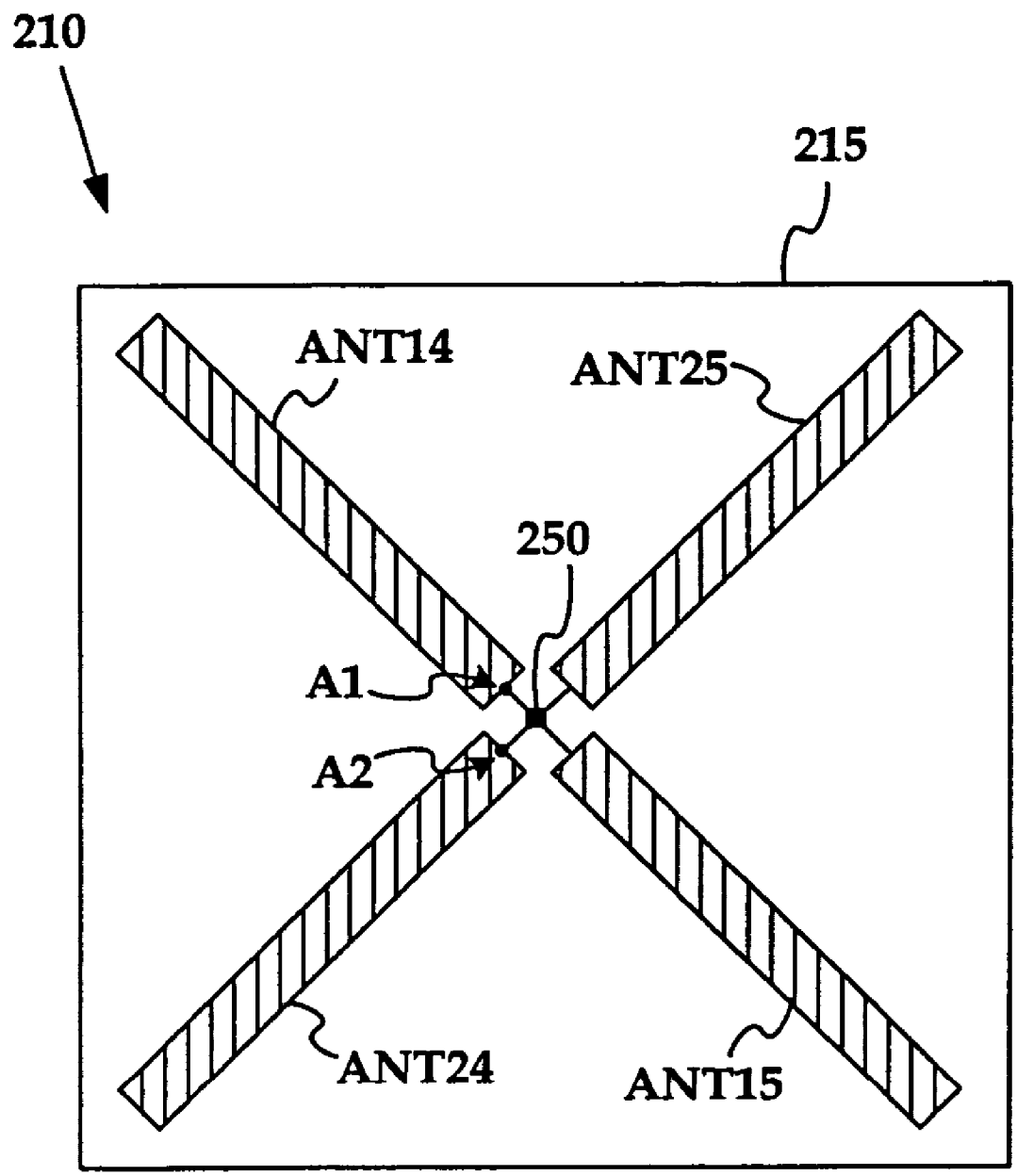
FIG. 2 is a view of another RFID tag with a second sample type of antenna system.

FIG. 2 is a view of another sample RFID tag 210 that may be used with the invention. Tag 210 is formed on a non-conducting substrate 215. Two substantially collinear antenna segments ANT14, ANT15 form a linear antenna for a first dominant polarization direction, while another two substantially collinear antenna segments ANT24, ANT25 form a second linear antenna for a second dominant polarization direction. The geometry of these antennas is especially useful if the interrogating RF wave is linearly polarized. Such a wave will generate a component in each of the linear antennas.

A chip 250 on tag 210 includes a circuit, which generates backscatter. Chip 250 drives at least one of the antenna segments, such as segment ANT14. Driving may be with respect to a reference, which in turn may be applied to drive the complementary antenna segment ANT15. For a first polarization, driving is at an antenna point A1 of segment ANT14, and optionally also segment ANT15. For a second polarization, driving is at an antenna point A2 of segment ANT24, and optionally also segment ANT25.

Regardless of what type antenna system is employed by the RFID tag, the invention provides driving RF ports of a circuit, which in turn drive the points of the antenna system. Driving the RF ports may be implemented in a number of ways. One such way is to drive the RF ports with a common modulation signal. Another such way is to alternately couple and uncouple the RF ports together, according to a control signal. During the times when the RF ports are uncoupled, they could be operating either from a common, or from different modulating signals. In one embodiment, the control signal is the same as one or both of the modulating signals, and so on. Examples of such ways are discussed in more detail below.

Figure 3:
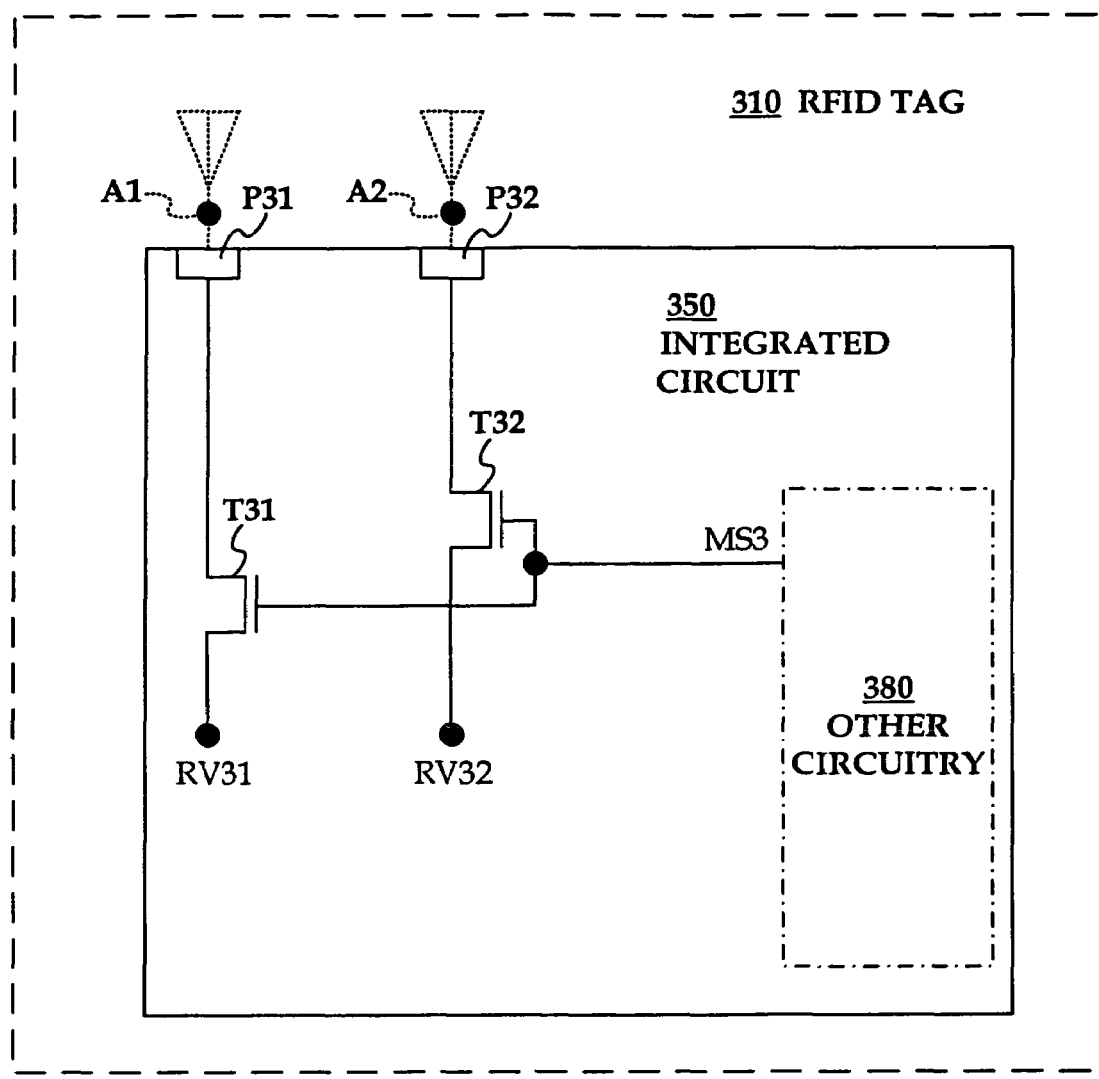
FIG. 3 is a hybrid circuit diagram of a circuit for an RFID tag, where a common modulating signal drives different RF ports.

FIG. 3 shows a hybrid circuit diagram of a circuit 350 for an RFD tag 310. Tag 310 may be implemented with an antenna system configured so that it receives RF signals, and can retransmit different polarizations by being driven at different antenna points A1, A2.

Circuit 350 may advantageously be provided as an integrated circuit. This will result in economical manufacture, and small size. A number of its components are provided in block 380, labeled OTHER CIRCUITRY.

Circuit 350 includes a first RF port P31, which is coupled to first antenna point A1 when the RFID tag is assembled. Circuit 350 also includes a second RF port P32, which is coupled to second antenna point A2 when the RFID tag is assembled. RF ports P31, P32 are also known as ports. Coupling to the antenna points may be by wire, bump soldering, or other ways known in the art.

Circuit 350 moreover includes a first modulating switch T31. Switch T31 is configured to selectively couple and uncouple port P31 to a first reference voltage RV31. Coupling and uncoupling is performed responsive to a modulating signal MS3. Reference voltage RV31 may be optionally further coupled to another RF port (not shown) complementary to port P31, and which would in turn be coupled to another antenna point (not shown) that is complementary to point A1.

Circuit 350 furthermore includes a second modulating switch T32. Switch T32 is configured to selectively couple and uncouple port P32 to a second reference voltage RV32. Coupling and uncoupling is performed responsive to modulating signal MS3. Reference voltage RV32 may be optionally further coupled to another RF port (not shown) complementary to port P32, and which would in turn be coupled to another antenna point (not shown) that is complementary to point A2. In addition, reference voltage RV32 may be equivalent to reference voltage RV31, such as by being coupled with it. Reference voltages RV31 and RV32 may further be a common ground.

Modulating signal MS3 is preferably a signal that alternates, and wherein its alternation causes coupling and uncoupling. The alternation thus affects the impedance of the antenna system, which in turn causes backscatter.

It will be observed that switches T31, T32 are driven by a common modulating signal MS3, in other words a single modulating signal. Accordingly, in this embodiment of the invention a single modulator may be used to generate signal MS3 that drives the two different ports P31, P32. The single modulator may have components in functional block 380. Having a single modulator results in less occupied space than where two modulators are provided.

Switches T31 and T32, as well as other switches in this description, may be made from switching circuits such as transistors. Such transistors include MOSFETs (Metal Oxide Semiconductor Field Effect Transistor) that include nFETs and pFETs, jFETs (junction FETs), BJTs (bipolar junction transistors), MESFETs (MEtal Semiconductor FETs), Fin-FETs (fin FETs), HBTs (Heterojunction Bipolar Transistors), IGFETs (Insulated Gate Transistors), TFTs (Thin Film Transistors), and so on. In the event they are made as MOSFET transistors, modulating signal MS3 may be applied directly to their gates.

Figure 4A:
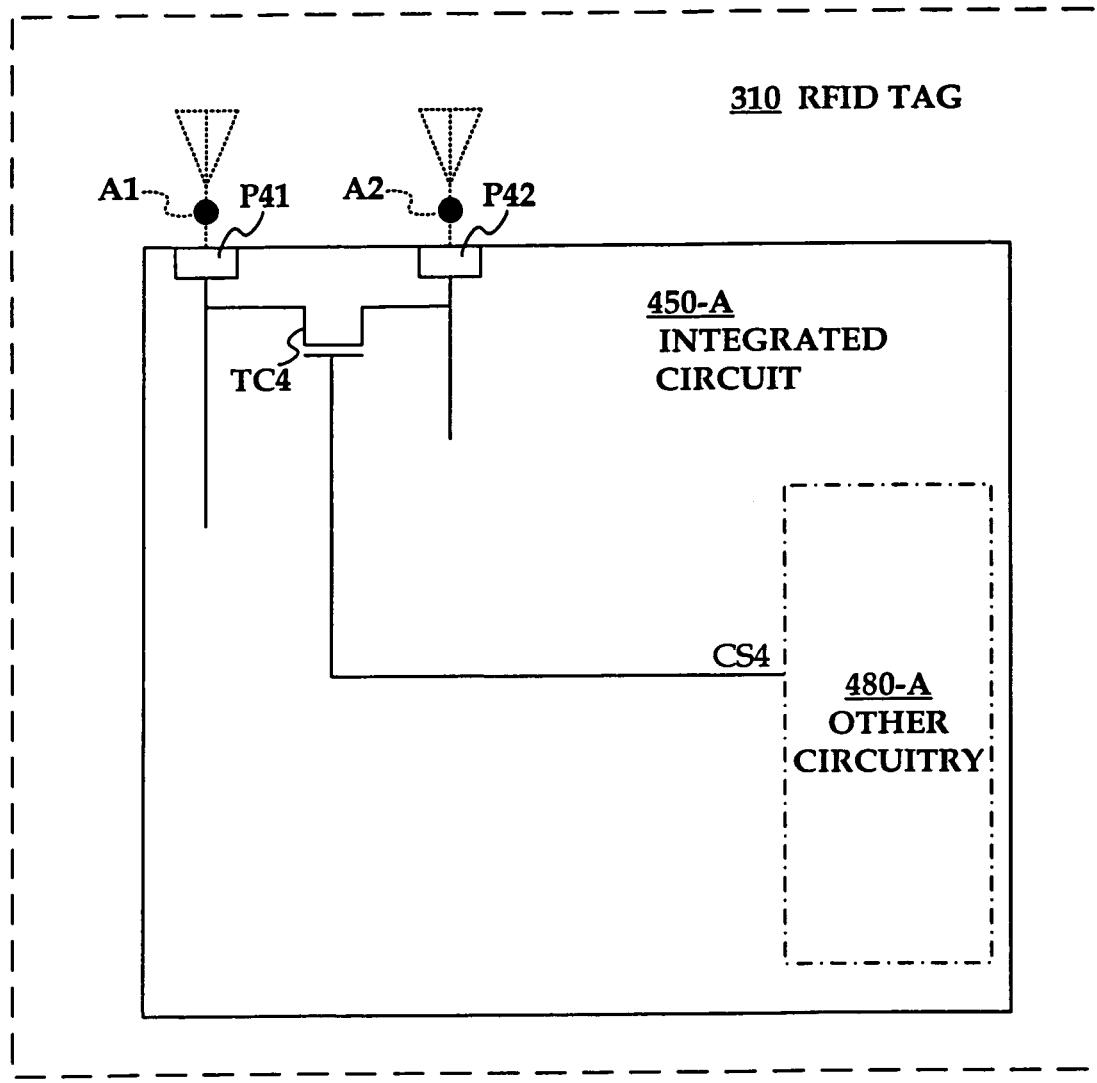
FIG. 4A is a hybrid circuit diagram of another circuit for an RFID tag, where a control signal controls coupling and uncoupling two RF ports.

FIG. 4A is a hybrid circuit diagram of a circuit 450-A for RFID tag 310. Circuit 450-A may be substituted in lieu of circuit 350 in FIG. 3, and antenna points of tag 310 (such as A1, A2) would be coupled instead to respective ports of circuit 450-A (such as P41, P42).

Circuit 450-A may be implemented in a number of ways, and a number of its components may be implemented in block 480-A. Circuit 450-A further includes a connecting switch TC4. Switch TC4 selectively couples and uncouples port P41 to port P42. Coupling and uncoupling is performed responsive to a control signal CS4.

It is preferred that switch TC4 be made from a MOSFET transistor, in which case control signal CS4 may be applied directly to the gate of the MOSFET transistor.

Figure 4B:
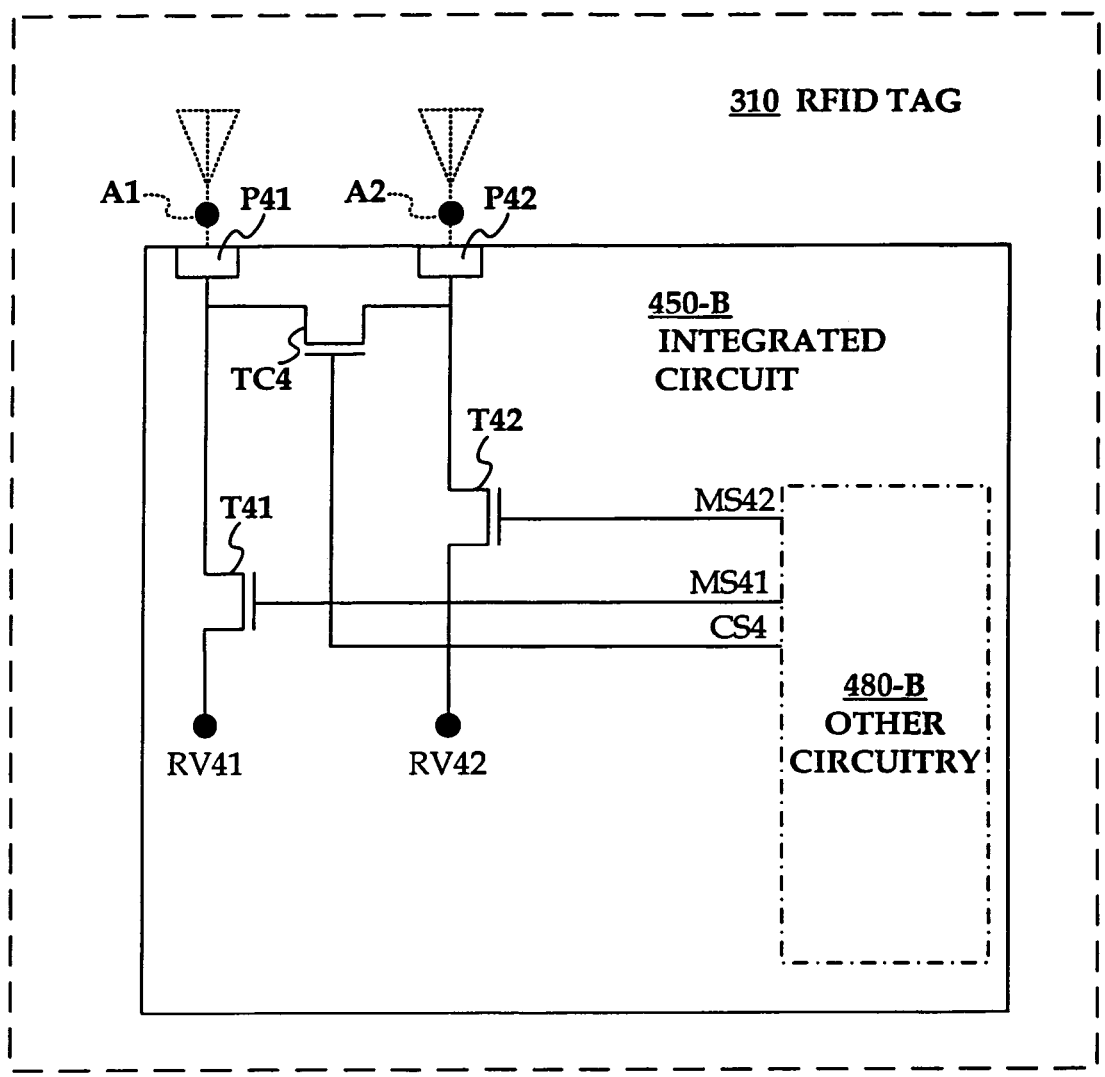
FIG. 4B is a hybrid circuit diagram of a possible more detailed embodiment of the circuit of FIG. 4A.

FIG. 4B is a hybrid circuit diagram of a possible more detailed embodiment of the circuit of FIG. 4A. In addition to what is shown for circuit 450-A, circuit 450-B includes a first modulating switch T41. Switch T41 is configured to selectively couple and uncouple port P41 to a first reference voltage RV41. Coupling and uncoupling is performed responsive to a modulating signal MS41. Reference voltage RV41 may be optionally further coupled to another RF port (not shown) complementary to port P41, and which would in turn be coupled to another antenna point (not shown) that is complementary to point A1.

Circuit 450-B furthermore includes a second modulating switch T42. Switch T42 is configured to selectively couple and uncouple port P42 to a second reference voltage RV42. Coupling and uncoupling is performed responsive to modulating signal MS42. Reference voltage RV42 may be optionally further coupled to another RF port (not shown) complementary to port P42, and which would in turn be coupled to another antenna point (not shown) that is complementary to point A2.

It is preferred that switches T41 and T42 be made from MOSFET transistors, in which case modulating signals MS41, MS42 may be applied directly to the gates of the MOSFET transistors, as shown. In addition, reference voltage RV41 may be equivalent to reference voltage RV42, such as by being coupled with it. Reference voltages RV41 and RV42 may further be a common ground.

Modulating signals MS41 and MS42 are generated from block 480-B. While RF port P41 is coupled, via switch TC4, to RF port P42, modulating signal MS41 is preferably the same as modulating signal MS42. But while RF port P41 is not coupled to RF port P42, modulating signal MS41 may be the same or different than modulating signal MS42. Alternately, modulating signal MS41 may have some similar and some different aspects than modulating signal MS42. For example, modulating signal MS41 may alternate at a different frequency than modulating signal MS42. Or they may alternate at the same frequency, but with a different phase. Or one of modulating signals MS41 and MS42 may be modulating, while the other one might not.

Figure 5:
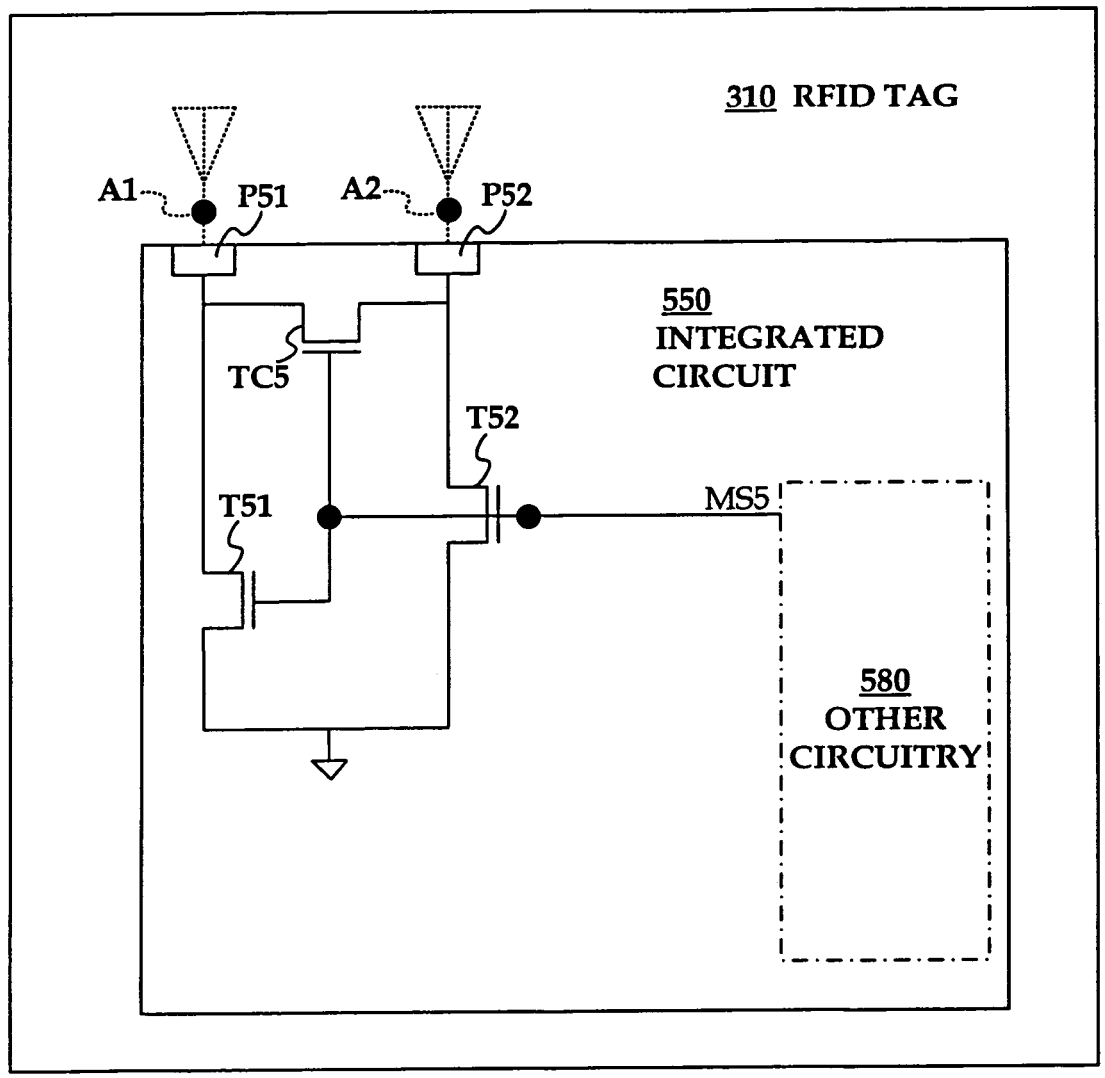
FIG. 5 is a hybrid circuit diagram of yet another circuit for an RFID tag, where two RF ports are driven by a common modulating signal, and further where the modulating signal controls coupling and uncoupling of the two RF ports.

FIG. 5 is a hybrid circuit diagram of a circuit 550 for RFID tag 310. Circuit 550 may be substituted in lieu of circuit 350 in FIG. 3, and antenna points of tag 310 (such as A1, A2) would be coupled instead to respective ports of circuit 550 (such as P51, P52).

Circuit 550 may be implemented in a number of ways, such as a semiconductor integrated circuit and so on. In addition, a number of its components may be implemented in block 580, which generates a modulating signal MS5.

Circuit 550 includes a first modulating switch T51. Switch T51 is configured to selectively couple and uncouple port P51 to a ground, which may be optionally further coupled to an antenna point that is complementary to point A1. Coupling and uncoupling is performed responsive to modulating signal MS5. Circuit 550 furthermore includes a second modulating switch T52. Switch T52 is configured to selectively couple and uncouple port P52 to the ground, which may be optionally further coupled to an antenna point that is complementary to point A2. Coupling and uncoupling is performed responsive to modulating signal MS5.

Circuit 550 additionally includes a connecting switch TC5. Switch TC5 selectively couples and uncouples port P51 to port P52. Coupling and uncoupling is performed responsive to modulating signal MS5.

It will be appreciated that the example of FIG. 5 is a special case of what is shown in FIG. 3, FIG. 4A, and FIG. 4B. For circuit 550, the modulating signal for first switch T51 is the same as for second switch T52, and further the same as the control signal for switch TC5.

It is preferred that switches T51, T52, TC5 be made from MOSFET transistors, in which case a modulating signal MS5 may be applied directly to the gates of the MOSFET transistors, as shown.

In a further aspect of the invention, switches T51, T52, TC5 are provided as a single semiconductor device. Such is described below in more detail.

Figure 6:
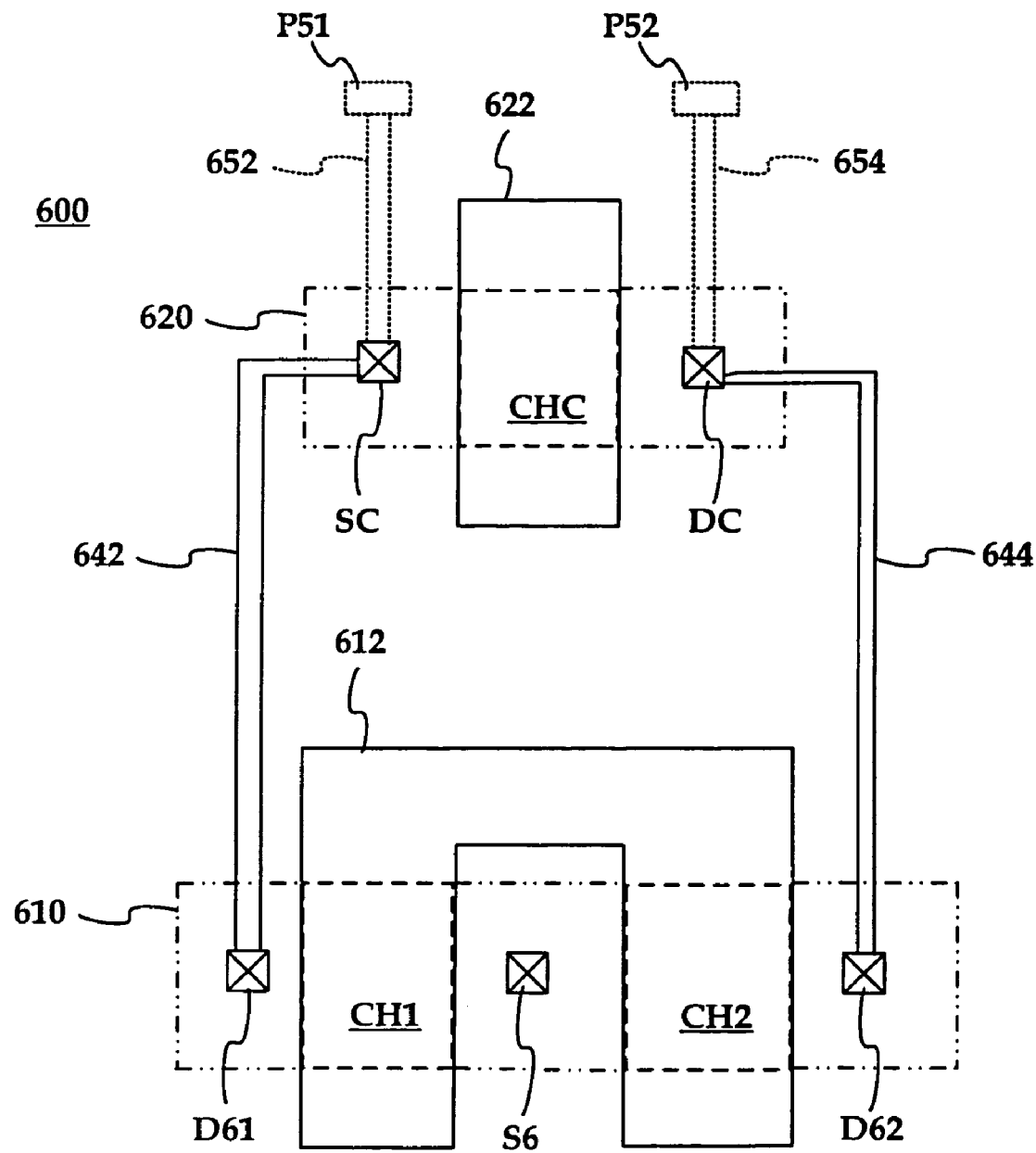
FIG. 6 is a layout for implementing components of the hybrid circuit diagram of FIG. 5 in a semiconductor device.

FIG. 6 is a layout for implementing switches T51, T52, TC5 of FIG. 5 in a semiconductor device. An area 610 in a substrate 600 is separated vertically from a conductive layer 612 by an insulating layer (not shown). The insulating layer may be made from oxide, and conductive layer 612 from polycrystalline or metallic material.

When implanted with dopants, areas 610 and 612 define three implants, where layer 612 does not cover area 610. Substrate 600 may be made from p-type silicon, in which case the dopants are advantageously n-type. (Alternately, substrate 600 may be made from n-type silicon, in which case the dopants are advantageously p-type.) Contacts are then provided for the implants. The geometry thus defines a source S6, shown at the contact, and two drains D61, D62, also shown at the contact.

It will be recognized that transistor T51 of FIG. 5 results as a MOSFET between source S6 and drain D61. Indeed, a first channel CH1 is defined between source S6 and drain D61. Further, transistor T52 results as a MOSFET between source S6 and drain D62, as a second channel CH2 is defined between source S6 and drain D62. Further, conductive layer 612 operates as a common gate to transistors T51 and T52, essentially combining transistors T51 and T52 into a single device.

Moreover, area 620 in substrate 600 is separated vertically from a gate layer 622 by an insulating layer (not shown). When implanted with dopants, areas 620 and 622 define a fourth implant SC and a fifth implant DC, on which contacts may be deposited. Implant SC may be coupled to implant D1 via conductor 642, and implant DC may be coupled to implant D2 via conductor 644.

In each case, the dopant density and other parameters have preferably the needed values to form MOSFET transistors.

This way, connecting transistor TC5 of FIG. 5 results as a MOSFET between source SC and drain DC. Indeed, a third channel CHC is defined between the implant SC and implant DC, and gate layer 622 is over it.

The device of FIG. 6 may be used for implementing switches T51, T52, TC5 of FIG. 5. Indeed, source SC may be coupled with RF port P51 using conductor 652, and drain DC may be coupled with RF port P52 using conductor 654. Moreover, conductive layer 612 can be coupled with gate layer 622, in which case it also switches transistor TC5.

Figure 7:
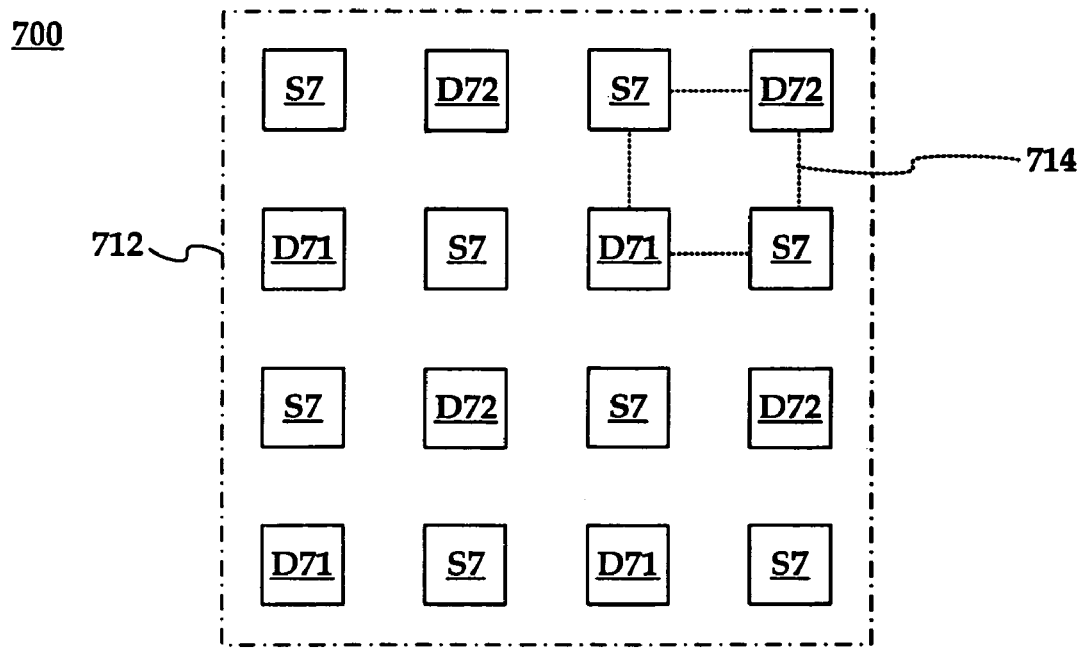
FIG. 7 illustrates a first optimized layout in abstract form for implementing the structure of FIG. 6 in a compact and efficient fashion.
Figure 8:
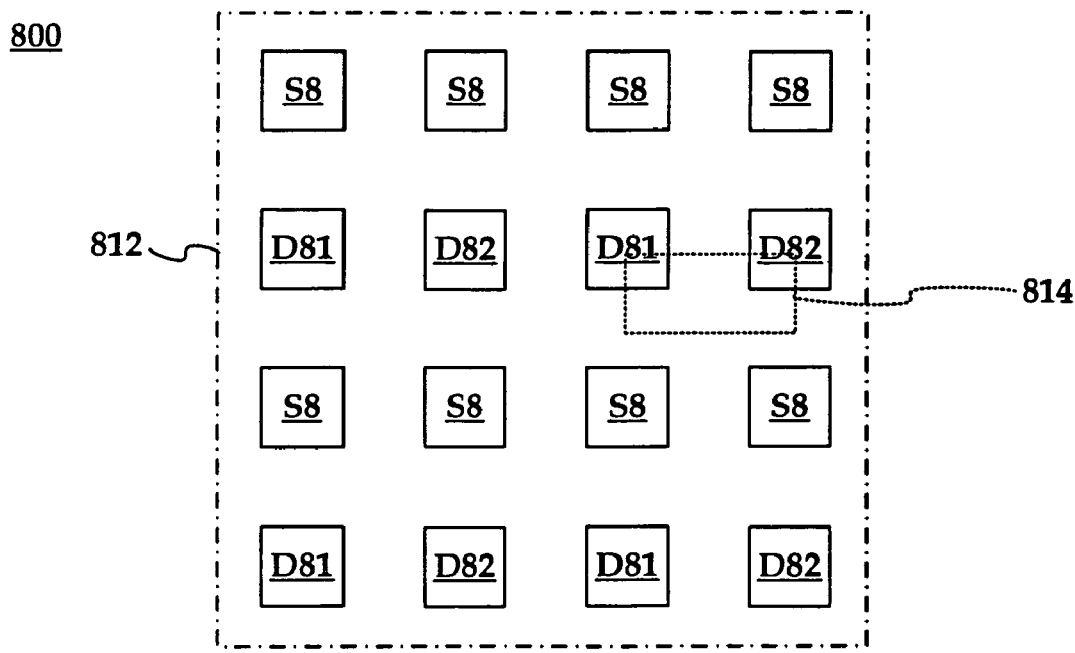
FIG. 8 illustrates a second optimized layout in abstract form for implementing the structure of FIG. 6 in a compact and efficient fashion.

FIG. 7 and FIG. 8 illustrate abstract layouts 700, 800, for implementing the structure of FIG. 6 in a compact and efficient fashion. It will be appreciated that these are especially useful if any one structure has insufficient driving capacity.

In FIG. 7, source regions S7 are located diagonally, in a checkerboard fashion. First and second drain regions D71, D72 are located alternatingly, in the spaces left between source regions S7. A common gate 712 has a minimum unit tile 714 that is cross-shaped.

In FIG. 8, source regions S8 are in a line, while first and second drain regions D71, D72 are also in a line but alternate. A common gate 812 has a minimum unit tile 814 that is T-shaped, here shown inverted. In a variant of layout 800, gate 812 is interrupted in horizontal lines, between neighboring source regions S8.

In both FIG. 7 and FIG. 8, like regions are connected together by suitable conductors, and so on. Further, each is made by repeating the structure of a unit tile.

Figure 9:
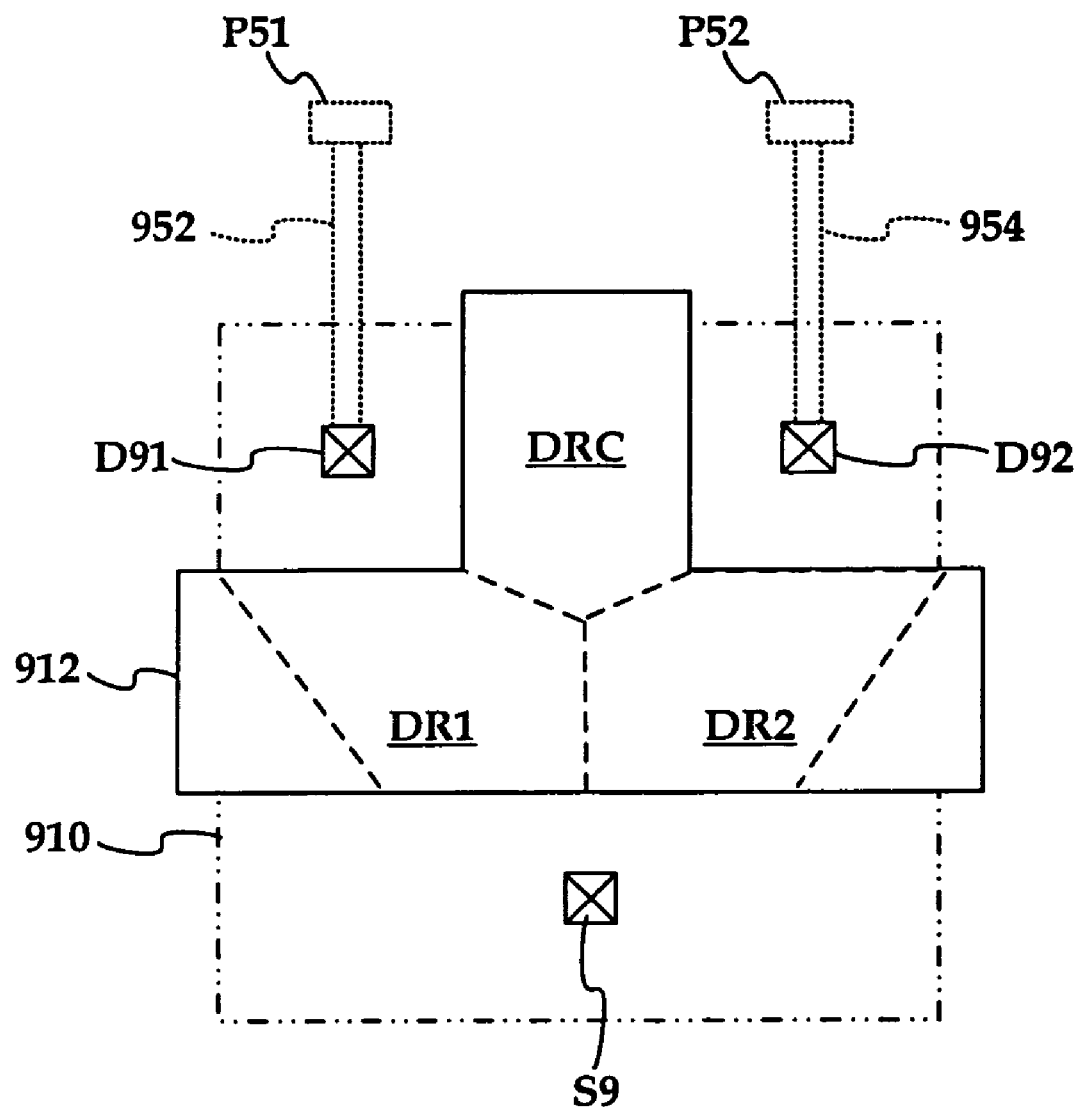
FIG. 9 illustrates a particular implementation of a unit tile of the optimized layout of a variant of FIG. 8.

FIG. 9 shows a unit tile of the variant of layout 800. The unit tile for the layout of FIG. 700 is analogous.

In a substrate 900, an area 910 is separated vertically from a conductive layer 912 by an insulating layer (not shown). Layer 912 is T-shaped, here shown inverted. The insulating layer may be made from oxide, and conductive layer 912 from polycrystalline or metallic material.

When implanted with dopants, areas 910 and 912 define in substrate 900 three regions where layer 912 does not cover area 910. Substrate 900 may be made from p– type silicon, in which case the dopants are advantageously n-type. (Alternately, substrate 600 may be made from n-type silicon, in which case the dopants are advantageously p– type.) Contacts are then provided for the regions. The geometry thus defines two drain regions D91, D92, and a source region with one or more contacts S9.

It will be recognized that a very compact device is thus generated for an RFID tag, that can drive the two RF ports non-independently. Transistor T51 of FIG. 5 results as a MOSFET between source S9 and drain D91, as a channel DR1 is defined in substrate 900 between source S9 and drain D91. Additionally, transistor T52 results as a MOSFET between source S9 and drain D92, as a channel DR2 is defined in substrate between source S9 and drain D92. Moreover, connecting transistor TC5 results as a MOSFET between drain D91 and drain D92, as a connecting channel DRC is defined in substrate 900 between drain D91 and drain D92. Conductive layer 912 operates as a common gate for all three transistors T51, T52, TC5. Indeed, a voltage on it affects concurrently all channels DR1, DR2, DRC. Drain regions D1, D2 may be electrically coupled with output RF ports P51, P52, via conductors 952, 954, respectively.

Figure 10:
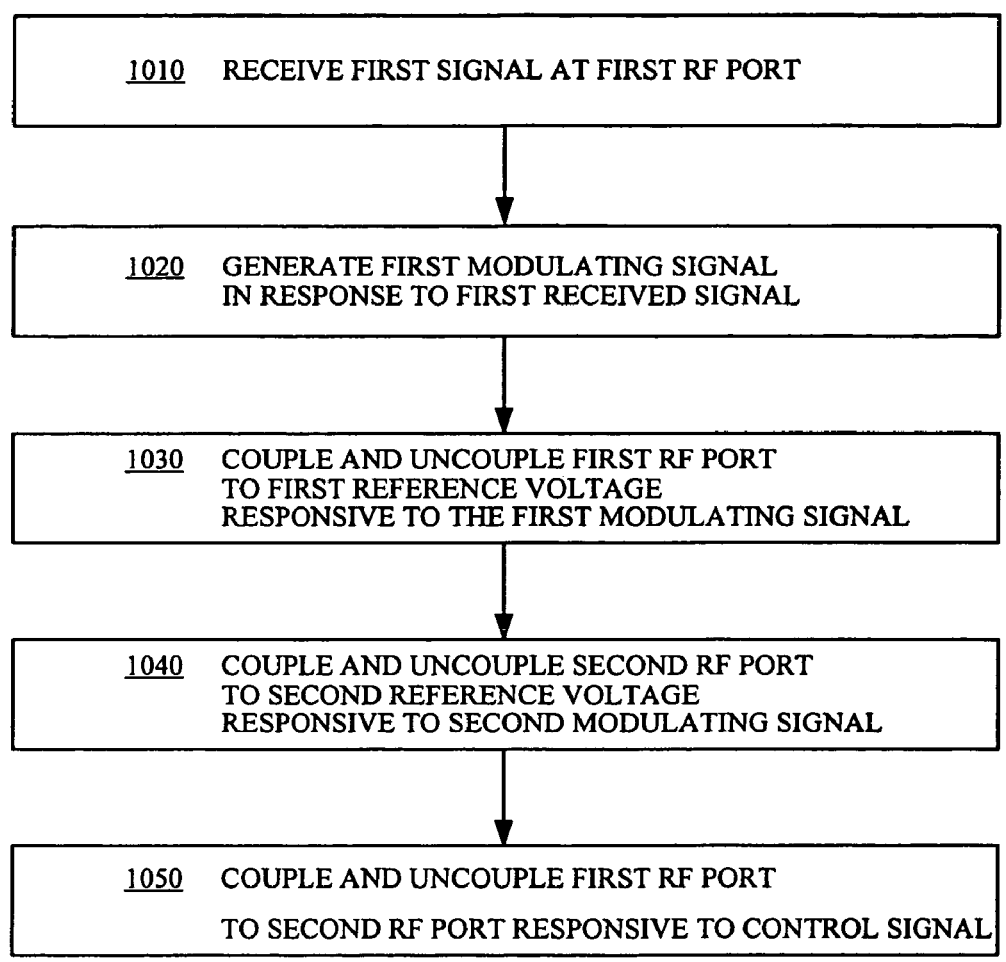
FIG. 10 is a flowchart illustrating a method, all according to embodiments of the present invention.

FIG. 10 is flowchart 1000 illustrating a method according to an embodiment of the invention. The method of flowchart 1000 may be practiced by different embodiments of the invention, including but not limited to tags 110, 210, 310, chip 250, and circuits 350, 450-A, 450-B, and 550. Furthermore, many of the terms of FIG. 10 draw their meaning from the description above.

At block 1010, a first signal is received at a first antenna port. At next block 1020, a first modulating signal is generated in response to the first received signal. At a next block 1030, the first port is coupled and uncoupled to a first reference voltage responsive to the first modulating signal. At a next block 1040, a second port is coupled and uncoupled to a second reference voltage responsive to a second modulating signal, which may be the same as the first modulating signal or not. At optional next block 1050, the first port is coupled and uncoupled to the second port, responsive to a control signal. The control signal may be the same as the first modulating signal.

Numerous details have been set forth in this description, which is to be taken as a whole, to provide a more thorough understanding of the invention. In other instances, well-known features have not been described in detail, so as to not obscure unnecessarily the invention.

The invention includes combinations and subcombinations of the various elements, features, functions and/or properties disclosed herein. The following claims define certain combinations and subcombinations, which are regarded as novel and non-obvious. Additional claims for other combinations and subcombinations of features, functions, elements and/or properties may be presented in this or a related document.

What is claimed is:

1. A circuit for use in an RFID tag connectible to first and second antennas, comprising:
   a first RF port configured for connection to the first antenna;
   a first modulating switch configured to selectively couple and uncouple the first RF port to a first refererence voltage responsive to a modulating signal;
   a second RF port configured for connection to the second antenna; and
   a second modulating switch configured to selectively couple and uncouple the second RF port to a second reference voltage responsive to the modulating signal.

2. A circuit for use in an RFID tag, comprising:
   a first RF port;
   a first modulating switch configured to selectively couple and uncouple the first RF port to a first reference voltage responsive,to a modulating signal;
   a second RF port; and
   a second modulating switch configured to selectively couple and uncouple the second RF port to a second reference voltage responsive to the modulating sigpal, wherein:
   the RFID tag has an antenna system adapted to receive RF signals of diverse polarizations,
   the first RF port is adapted to receive an RF signal of a first polarization, and the second RF port is adapted to receive an RF signal of a second polarization.

3. The circuit of claim 1, wherein
   the first reference voltage is equivalent to the second reference voltage.

4. A circuit for use in an RFID tag, comprising:
   a first RF port;
   a first modulating switch configured to selectively couple and uncouple the first RF port to a first reference voltage responsive to a modulating signal;
   a second RF port;
   a second modulating switch configured to selectively couple and uncouple the second RF port to a second reference voltage responsive to the modulating signal; and a connecting switch configured to selectively couple and uncouple the first RF port and the second RF port responsive to a control signal.

5. The circuit of claim 4, wherein
the control signal is the modulating signal.

6. The circuit of claim 4, wherein
the connecting switch includes a transistor.

7. The circuit of claim 6, wherein
the transistor is one of a MOSFET, a jFET, a BJT, a MESFET, a FinFET, an HBT, an IGFET, and a TFT.

8. A device for use in an RFID tag having first and second antennas, comprising:
means for generating a modulating signal in response to a first signal received at a first RF port configured for connection to the fist antenna;
means for coupling and uncoupling the first RF port to a first reference voltage responsive to the modulating signal; and
means for coupling and uncoupling a second reference voltage to a second RF port responsive to the modulating signal, the second RF port connection for coupling to the second antenna.

9. The device of claim 8, wherein
the first reference voltage is equivalent to the second reference voltage.

10. A device for use in an RFID tag, comprising:
means for generating a modulating signal in response to a first signal received at a first RF port;
means for coupling and uncoupling the first RF port to a first reference voltage responsive to the modulating signal;
means for coupling and uncoupling a second reference voltage to a second RF port responsive to the modulating signal; and
means for coupling and uncoupling the first RF port to the second RF port responsive to a control signal.

11. A device for use in an RFID tag, comprising:
means for generating a modulating signal in response to a first signal received at a first RF port;
means for coupling and uncoupling the first RF port to a first reference voltage responsive to the modulating signal;
means for coupling and uncoupling a second reference voltage to a second RF port responsive to the modulating signal; and means for coupling and uncoupling the first RF port to the second RF port responsive to a control signal, wherein the control signal is the modulating signal.

12. A device for use in an RFID tag, comprising:
means for generating a modulating signal in response to a first signal received at a first RF port;
means for coupling and uncoupling the first RF port to a first reference voltage responsive to the modulating signal; and
means for coupling and uncoupling a second reference voltage to a second RF port responsive to the modulating signal, wherein the means for coupling and uncoupling the first RF port to the second RF port includes a transistor.

13. The device of claim 12, wherein
the transistor is one of a MOSFET, a jFET, a BJT, a MESFET, a FinFET, an HBT, an IGFET, and a TFT.

14. A method for using a circuit for an RFID tag, the circuit configured for coupling to first and second antennas, comprising:
receiving a first signal at a first RF port configured for connection to the first antenna;
generating a modulatling signal in response to the first received signal;
coupling and uncoupling the first RF port to a first reference voltage responsive to the modulating signal; and
coupling and uncoupling a second reference voltage to a second RF port responsive to the modulating signal, the second RF port configured for connection to the second antenna.

15. The method of claim 14, wherein
the first reference voltage is equivalent to the second reference voltage.

16. The method of claim 14, further comprising:
coupling and uncoupling the first RF port to the second RF port responsive to a control signal.

17. The method of claim 16, wherein
the control signal is the modulating signal.

18. A circuit for use in an RFID tag, comprising:
a first RF port;
a second RF port; and
a connecting switch configured to selectively couple and uncouple the first RF port to the second RF port responsive to a control signal,
wherein the RFID tag has an antenna system adapted to receive RF signals of diverse polarizations, the first RF port is adapted to receive an RF signal of a first polarization, and the second RF port is adapted to receive an RF signal of a second polarization.

19. The circuit of claim 18, wherein
the connecting switch includes a transistor.

20. The circuit of claim 19, wherein
the transistor is one of a MOSFET, a jFET, a BJT, a MESFET, a FinFET, an HBT, an IGFET, and a TFT.

21. The circuit of claim 18, further comprising:
a first modulating switch configured to selectively couple and uncouple the first RF port to a first reference voltage responsive to a first modulating signal; and
a second modulating switch configured to selectively couple and uncouple the second RF port to a second reference voltage responsive to a second modulating signal.

22. The circuit of claim 21, wherein
the first modulating switch includes a transistor.

23. The circuit of claim 21, wherein
the first reference voltage is equivalent to the second reference voltage.

24. The circuit of claim 21 wherein
the first modulating signal is different than the second modulating signal.

25. The circuit of claim 21, wherein
the first modulating signal alternates at a different frequency than the second modulating signal.

26. The circuit of claim 21, wherein
the first modulating signal alternates at the same frequency but with a different phase than the second modulating signal.

27. The circuit of claim 21, wherein
the first modulating signal is the same as the second modulating signal.

28. The circuit of claim 21, wherein
the first modulating signal is the control signal.

29. A device for use in an RFID tag, comprising,
means for generating a control signal in response to a first signal received at a first RF port;

means for coupling and uncoupling, responsive to the control signal the first RF port to a second RF port;
means for coupling and uncoupling the first RF port to a first reference voltage responsive to a first modulating signal; and
means for coupling and uncoupling the second RF port to a second reference voltage responsive to a second modulating signal.

30. The device of claim 29, wherein
the means for coupling and uncoupling the first RF port to the second RF port includes a transistor.

31. The device of claim 30, wherein
the transistor is one of a MOSFET, a jFET, a BJT, a MESFET, a FinFET, an HBT, an IGFET, and a TFT.

32. The device of claim 29, wherein
the first reference voltage is equivalent to the second reference voltage.

33. The device of claim 29, wherein
the first modulating signal is different than the second modulating signal.

34. The device of claim 29, wherein
the first modulating signal alternates at a different frequency than the second modulating signal.

35. The device of claim 29, wherein
the first modulating signal alternates at the same frequency but with a different phase than the second modulating signal.

36. The device of claim 29, wherein
the first modulating signal is the same as the second modulating signal.

37. The device of claim 29, wherein
the first modulating signal is the control signal.

38. A method for using a circuit for an RFID tag, comprising:
receiving a first signal at a first RF port;
generating a control signal in response to the first received signal;
coupling and uncoupling, responsive to the control signal the first RF port to a second RF port
coupling and uncoupling the first RF port to a first reference voltage responsive to a first modulating signal; and
coupling and uncoupling the second RF port to a second reference voltage responsive to a second modulalting signal.

39. The method of claim 38, wherein
the first reference voltage is equivilent to the second reference voltage.

40. The method of claim 38, wherein
the first modulating signal alternates at a different frequency than the second modulating signal.

41. The method of claim 38, wherein
the first modulating signal alternates at the same frequency with at a different phase than the second modulating signal.

42. The method of claim 38, wherein
the first modulating signal is the same as the second modulating signal.

43. The method of claim 38, wherein
the first modulating signal is the control signal.

* * * * *

UNITED STATES PATENT AND TRADEMARK OFFICE
CERTIFICATE OF CORRECTION

PATENT NO.        : 7,528,728 B2
APPLICATION NO. : 11/213631
DATED             : May 5, 2009
INVENTOR(S)       : Oliver et al.

It is certified that error appears in the above-identified patent and that said Letters Patent is hereby corrected as shown below:

1) Please delete "Christpher" in the specification, column 1, line 10 and insert --Christopher--, therefor.

2) Please delete "2002Nov. 14" in the specification, column 1, line 56 and insert --November 14, 2002--, therefor.

3) Please delete "FIGURE" in the specification, column 3, line 28 and insert --FIGURE 1--, therefor.

4) Please delete "RFD" in the specification, column 4, line 20 and insert --RFID--, therefor.

5) Please delete "refererence" in claim 1, column 8, line 32 and insert --reference--, therefor.

6) Please delete ",to" in claim 2, column 8, line 43 and insert --to--, therefor.

7) Please delete "sigpal" in claim 2, column 8, line 47 and insert --signal--, therefor.

8) Please delete "fist" in claim 8, column 9, line 15 and insert --first--, therefor.

9) Please delete "modulatling" in claim 14, column 10, line 1 and insert --modulating--, therefor.

10) Please delete ",further" in claim 21, column 10, line 35 and insert --, further--, therefor.

11) Please delete "21" in claim 24, column 10, line 48 and insert --21,--, therefor.

UNITED STATES PATENT AND TRADEMARK OFFICE
CERTIFICATE OF CORRECTION

PATENT NO. : 7,528,728 B2
APPLICATION NO. : 11/213631
DATED : May 5, 2009
INVENTOR(S) : Oliver et al.

It is certified that error appears in the above-identified patent and that said Letters Patent is hereby corrected as shown below:

12) Please delete "comprising," in claim 29, column 10, line 65 and insert --comprising:--, therefor.

13) Please delete "modulalting" in claim 38, column 12, line 13 and insert --modulating--, therefor.

14) Please delete "equivilent" in claim 39, column 12, line 16 and insert --equivalent--, therefor.

Signed and Sealed this

Seventeenth Day of November, 2009

David J. Kappos
*Director of the United States Patent and Trademark Office*